United States Patent [19]

Barr et al.

[11] Patent Number: 4,894,314

[45] Date of Patent: Jan. 16, 1990

[54] PHOTOINITIATOR COMPOSITION CONTAINING BIS KETOCOUMARIN DIALKYLAMINO BENZOATE, CAMPHORQUINONE AND/OR A TRIPHENYLIMIDAZOLYL DIMER

[75] Inventors: Robert Barr, Huntington Beach; Leo Roos, Laguna Beach; Lawrence Crane, Tustin, all of Calif.

[73] Assignee: Morton Thiokol, Inc., Chicago, Ill.

[21] Appl. No.: 273,757

[22] Filed: Nov. 16, 1988

Related U.S. Application Data

[63] Continuation of Ser. No. 43,054, Apr. 27, 1987, abandoned, which is a continuation-in-part of Ser. No. 930,686, Nov. 12, 1986, abandoned.

[51] Int. Cl.$^4$ .......................... G03C 1/68; G03C 1/70
[52] U.S. Cl. ........................... 430/281; 522/14; 522/2; 430/945; 430/926; 430/919; 430/918; 430/920
[58] Field of Search ............... 430/945, 281, 926, 919, 430/918, 920; 522/14, 2; 502/167, 522

[56] References Cited

U.S. PATENT DOCUMENTS

| | | | |
|---|---|---|---|
| Re. 28,789 | 4/1976 | Chang | 96/86 P |
| 610,361 | 9/1898 | Manasse | 568/374 |
| 2,202,865 | 6/1940 | Piggott et al. | 260/471 |
| 3,390,994 | 7/1968 | Cescon | 96/48 |
| 3,445,233 | 5/1969 | Cescon | 96/90 |
| 3,445,234 | 5/1969 | Cescon | 96/90 |
| 3,458,311 | 7/1969 | Alles | 96/35.1 |
| 3,469,982 | 9/1969 | Celeste | 96/35.1 |
| 3,479,185 | 11/1969 | Chambers | 430/919 X |
| 3,549,367 | 12/1970 | Chang et al. | 96/35.1 |
| 3,615,454 | 10/1971 | Cescon | 96/35.1 |
| 3,615,481 | 10/1971 | Looney | 96/48 |
| 3,615,567 | 10/1971 | Wilson | 96/90 |
| 3,637,385 | 1/1972 | Hayes et al. | 96/48 |
| 3,658,543 | 4/1972 | Gerlach et al. | 96/90 |
| 3,666,732 | 5/1972 | Skoultchi et al. | 260/78.5 BB |
| 3,697,280 | 10/1972 | Strilko | 96/90 |
| 3,756,827 | 9/1973 | Chang | 96/86 P |
| 3,784,557 | 1/1974 | Ceson | 260/309 |
| 3,844,790 | 10/1974 | Chang et al. | 430/920 X |
| 3,887,450 | 6/1975 | Gilano | 204/159.15 |
| 3,888,672 | 6/1975 | Lee | 96/35.1 |
| 3,926,637 | 12/1975 | Bartolini | 96/115 R |
| 3,926,643 | 12/1975 | Chang | 96/115 P |
| 3,951,663 | 4/1976 | Ross | 96/67 |
| 3,953,309 | 4/1976 | Gilano et al. | 204/159.16 |
| 4,022,618 | 5/1977 | Bartolini et al. | 96/27 H |
| 4,110,184 | 8/1978 | Dart et al. | 204/159.23 |
| 4,113,593 | 9/1978 | Barzynski et al. | 522/14 X |
| 4,147,552 | 4/1979 | Specht et al. | 96/115 R |
| 4,247,618 | 1/1981 | Dessauer et al. | 430/342 |
| 4,247,623 | 1/1981 | Guild | 430/281 X |
| 4,252,887 | 2/1981 | Dessauer | 430/281 |
| 4,278,751 | 7/1981 | Specht et al. | 430/281 |
| 4,289,844 | 9/1981 | Specht et al. | 430/281 |
| 4,311,783 | 1/1982 | Dessauer | 430/270 |
| 4,366,228 | 12/1982 | Specht et al. | 430/281 |
| 4,457,818 | 7/1984 | Denyer et al. | 204/159.19 |
| 4,459,193 | 7/1984 | Ratcliffe et al. | 204/159.23 |
| 4,529,491 | 7/1985 | van der Hauw et al. | 204/159.23 |
| 4,534,839 | 8/1985 | Schaefer | 204/159.23 |
| 4,565,769 | 1/1986 | Dueber et al. | 430/281 |
| 4,594,309 | 6/1986 | Guillet | 430/270 |
| 4,594,310 | 6/1986 | Nagasaka | 430/281 |
| 4,674,980 | 6/1987 | Ibsen et al. | 522/14 X |

OTHER PUBLICATIONS

Specht et al., "Ketocoumarins–A New Class of Triplet Sensitizers", Tetrahedron, vol. 38, No. 9, pp. 1203–1211 (1982).

Cescon et al., "Some Reactions of Triarylimidazolyl Free Radicals", J. Org. Chem., vol. 36, No. 16, pp. 2267–2272 (1971).

Dessauer et al., "Modulation of Biimidazole-Leucodye Photochemical Reaction by Photopolymerization", Photo. Science and Eng., vol. 23, No. 5, pp. 287–289 (1979).

Cescon et al., "Some Properties of Triarylimidazolyl Radicals and Their Dimers", J. Org. Chem., vol. 36, No. 16, pp. 2262–2267 (1979).

*Primary Examiner*—Paul R. Michl
*Assistant Examiner*—Cynthia Hamilton
*Attorney, Agent, or Firm*—Richard J. Sheridan; Gerald K. White

[57] ABSTRACT

Photoinitiator compositions are disclosed which contain 3,3'-carbonyl bis(7-diethylaminocoumarin); an alkyl ester of a p-dialkylamino benzoic acid; and either camphorquinone or a 2,4,5-triphenylimidazolyl dimer. Photoinitiators are also provided which contain 3,3'-carbonyl bis(7-diethylaminocoumarin); an alkyl ester of a p-dialkylamino benzoic acid; camphorquinone and a 2,4,5-triphenylimidazolyl dimer. These latter photoinitiators are particularly useful in photopolymerizable compositions which are polymerized by exposure to visible laser light.

35 Claims, No Drawings

PHOTOINITIATOR COMPOSITION CONTAINING BIS KETOCOUMARIN DIALKYLAMINO BENZOATE, CAMPHORQUINONE AND/OR A TRIPHENYLIMIDAZOLYL DIMER

This is a continuation of co-pending application Ser. No. 07/043,054 filed on Apr. 27, 1987, which is in turn a continuation-in-part of Ser. No. 06/930,686 filed Nov. 12, 1986 both now abandoned.

BACKGROUND OF THE INVENTION

1. Field of the Invention

This invention relates to photoinitiator compositions useful in photopolymerizable compositions. It also relates to photopolymerizable compositions containing the photoinitiator compositions of this invention and to a process for making a photoresist which employs a photopolymerizable composition containing the photoinitiators of this invention.

2. Description of the Prior Art

Photoinitiators have long been used in photopolymerizable compositions to initiate photopolymerization upon exposure of the composition to actinic radiation, and to increase the speed at which the polymerization takes place.

Various compounds have been employed as photoinitiators. For instance, D. P. Specht et al. disclose in *Tetrahedron*, Vol. 38, No. 9, pages 1203 to 1211, 1982 in an article entitled "Ketocoumarins-A New Class of Triplet Sensitizers" that 3,3'-carbonyl biscoumarins, including the 7,7'-dialkylamino derivatives thereof, are efficient triplet sensitizers for photopolymerizable compositions. They further disclose that these compounds are useful in photoresist films and are very efficient in the 480–500 nm range, i.e. in the visible laser range.

In U.S. Pat. No. 4,289,844, issued Sept. 15, 1981, Specht et al. disclose a co-initiator system for photopolymerizable compositions which contains a carbonyl compound and an activator. The carbonyl compound is a 3-ketocoumarin, e.g. 3,3'-carbonylbis (7-diethylaminocoumarin). The activator may be selected from a variety of compounds such as amines other than a 3-ketocoumarin amine, acetic acid derivatives, phosphines, phosphites, bismuthines, arsines, stibines, sulfinic acid and sulfinic acid esters, sulfones, α- and B-dicarbonyls, ketones, bi-imidazoles and stannates. Examples of activators include 2,3-bornanedione (camphorquinone) and alkyl esters of p-dialkylamino benzoic acid. It is further disclosed that mixtures of activators may be employed, though no specific combinations are disclosed. However, Specht et al. do caution that not all free radical photopolymerization activators will work with their courmarins to provide the desired result. Some combinations are said to fail to achieve the desired speed.

U.S. Pat. No. 4,147,552 to Specht et al., issued Apr. 3, 1979, also discloses light sensitive compositions which employ 3,3'-carbonyl bis(7-diethylaminocoumarin) as a photosensitizer. This compound may be used in combination with other sensitizers, 3-benzoyl-7-methoxycoumarin being disclosed as the only example of such co-sensitizers. The 3,3'-carbonyl bis(7-diethylaminocoumarin) is stated to be of particular interest when lasers are used as the light source.

Specht et al., in U.S. Pat. No. 4,278,751 issued July 14, 1981, disclose a co-initiator system for a photopolymerizable composition. The co-initiator contains an amine-substituted ketocoumarin, such as 3,3'-carbonyl bis(7-diethylaminocoumarin), and an activator such as N-phenylglycine or N-methylindoleacetic acid. A comparative example (Example 9) employs 3,3'-carbonyl bis(7-diethylaminocoumarin) and ethyl p-dimethylaminobenzoate as the co-initiator.

U.S. Pat. No. 4,529,491, issued July 16, 1985 to Hauw et al., discloses photopolymerizable compositions which use benzil and/or fluorenone, a biphenylyl ketone and a reducing agent as the photosensitizer. The reducing agent may be 4-dimethylamino benzoate.

In U.S. Pat. No. 3,756,827, issued Sept. 4, 1973, Chang discloses photopolymerizable compositions containing a photosensitizer system which employs a cyclic cis α-dicarbonyl compound and an actinic radiation absorbing compound. The dicarbonyl compound may be 2,3-bornanedione (camphorquinone) and the actinic radiation absorbing compound can be a 7-dialkylamino-4-alkyl coumarin.

Biimidazoles (or imidazolyl dimers) have also be used in photoinitiating systems for photopolymerizable compositions. U.S. Pat. Nos. 3,479,185 (issued Nov. 18, 1969 to Chambers); 3,549,367 (issued Dec. 22, 1970 to Chang et al.) and 4,252,887 (issued Feb. 24, 1981 to Dessauer) disclose photoinitiators containing triarylimidazolyl dimers. These compounds also find utility in photosensitive, color forming compositions such as those disclosed in U.S. Pat. Nos. 3,784,557 (issued Jan. 8, 1974 to Cescon); 3,445,233 (issued May 20, 1969 to Cescon); 3,445,234 (issued May 20, 1969 to Cescon et al.); 3,390,994 (issued July 2, 1968 to Cescon); 3,615,481 (issued Oct. 26, 1971 to Looney); 3,658,543 (issued Apr. 25, 1972 to Gerlach et al.) and 4,247,618 (issued Jan. 27, 1981 to Dessauer et al.).

While the photoinitiators described above do provide useful photopolymerization speeds (photospeeds), there is still a need for photoinitiators which provide even faster photospeeds. Also, with the advent of lasers as the light source for the photopolymerization, a need has developed for photoinitiators which will provide photospeeds fast enough that relatively low power lasers can be used to polymerize photopolymerizable materials, for example photoresists, at commercial production rates.

SUMMARY OF THE INVENTION

The present invention provides compositions for initiating the photopolymerization of ethylenically unsaturated photopolymerizable materials, said compositions comprising:

(a) 3,3'-carbonyl bis(7-diethylaminocoumarin);
(b) an alkyl ester of p-dialkylamino benzoic acid; and
(c) a compound selected from the group consisting of camphorquinone and a 2,4,5-triphenylimidazolyl dimer.

This invention further provides compositions for initiating the photopolymerization of ethylenically unsaturated photopolymerizable materials, said composition comprising:

(a) 3,3'-carbonyl bis(7-diethylaminocoumarin);
(b) an alkyl ester of p-dialkylamino benzoic acid;
(c) camphorquinone; and
(d) a 2,4,5-triphenylimidazolyl dimer.

In accordance with this invention there are provided improved photopolymerizable compositions comprising an addition polymerizable compound containing ethylenic unsaturation and a photopolymerization initiating composition, wherein the improvement comprises a photopolymerization initiating composition comprising:
(a) 3,3'-carbonyl bis(7-diethylaminocoumarin);
(b) an alkyl ester of p-alkylamino benzoic acid; and
(c) a compound selected from the group consisting of camphorquinone and a 2,4,5-triphenylimidazolyl dimer.

There are further provided in accordance with this invention improved photopolymerizable compositions comprising an addition polymerizable compound containing ethylenic unsaturation, and a photopolymerization initiating composition wherein the improvement comprises a photopolymerization initiating composition comprising:
(a) 3,3'-carbonyl bis(7-diethylaminocoumarin);
(b) an alkyl ester of p-dialkylamino benzoic acid;
(c) camphorquinone; and
(d) a 2,4,5-triphenylimidazolyl dimer.

This invention also provides an improved process for making a photoresist which comprises preparing a photopolymerizable layer containing an addition polymerizable material and a polymerization initiating system; exposing a portion of said photopolymerizable layer to actinic light; and washing said layer with a solution which dissolves the unexposed portion of the photopolymerizable layer wherein the improvement comprises a polymerization initiating system comprising:
(a) 3,3'-carbonyl bis(7-diethylaminocoumarin);
(b) an alkyl ester of p-dialkylamino benzoic acid; and
(c) a compound selected from the group consisting of camphorquinone and a 2,4,5-triphenylimidazolyl dimer.

In accordance with the present invention there is also provided an improved process for making a photoresist which comprises preparing a photopolymerizable layer containing an addition polymerizable material and a polymerization initiating system; exposing a portion of said photopolymerizable layer to actinic light; and washing said layer with a solution which dissolves the unexposed portion of the photopolymerizable layer wherein the improvement comprises a polymerization initiating system comprising:
(a) 3,3'-carbonyl bis (7-diethylaminocoumarin);
(b) an alkyl ester of p-dialkylamino benzoic acid;
(c) camphorquinone; and
(d) a 2,4,5-triphenylimidazolyl dimer.

DESCRIPTION OF THE PREFERRED EMBODIMENT

The 3,3'-carbonyl bis(7-diethylaminocoumarin) used the practice of this invention has the structure

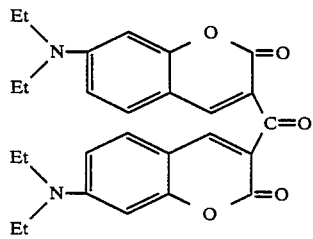

where "Et" represents ethyl groups.

The alky esters of p-dialkylamino benzoic acid employed in the invention are compounds having the general formula

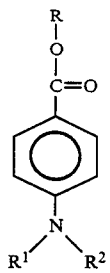

where R, $R^1$ and $R^2$ may be the same or different and are each alkyol, e.g. $C_1-C_7$ alkyl. Examples of these compounds include, but are not limited to, ethyl p-dimethylamino benzoate, ethyl p-diethylamino benzoate and 2-ethyl hexyl p-dimethylamino benzoate. Of these, ethyl p-diethylamino benzoate and is preferred.

Camphorquinone (also named 2,3-bornanedione) has the structure

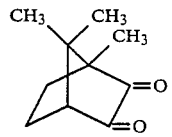

The 2,4,5-triphenylimidazolyl dimers useful in this invention are compounds of the general formula

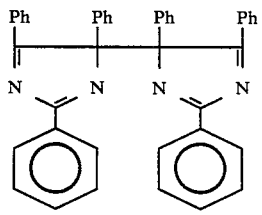

where "Ph" represents phenyl. Examples of these compounds include, but are not limited to 2,2'-bis(o-chlorophenyl)-4,4',5,5-tetraphenyl biimidazole; 2,2'-bis(o-methoxyphenyl)-4,4',5,5'-tetraphenyl biimidazole and tetraphenyl benzimidazole. The preferred compound of this type is 2,2'-bis(o-chlorophenyl)-4,4', 5,5'-tetraphenyl biimidazole which has the structure

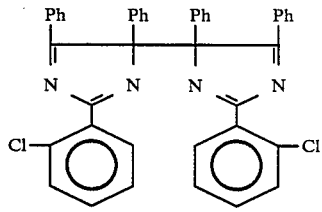

In one aspect, this invention provides compositions for initiating photopolymerization which comprise:
(a) 3,3'-carbonyl bis(7-diethylaminocoumarin);
(b) an alkyl ester of p-dialkylamino benzoic acid; and
(c) either camphorquinone or a 2,4,5-triphenylimidazolyl dimer.

These compositions are useful in photopolymerizable compositions which are cured (photopolymerized) by UV radiation. They do not, however, provide sufficient photospeed for curing with laser light, especially relatively low power laser light.

In a second aspect, this invention provides compositions for initiating photopolymerization which comprise:
(a) 3,3'-carbonyl bis(7-diethylaminocoumarin);
(b) an alkyl ester of p-dialkylamino benzoic acid;
(c) camphorquinone; and
(d) a 2,4,5-triphenylimidazolyl dimer.

It has been quite surprisingly found that when all four of these components are present in the photoinitiator composition they produce a synergistic effect on photospeed. Thus, the four component photoinitiator system provides photospeeds fast enough that photopolymerization can be achieved at commercial rates with either UV radiation or laser light, even relatively lower power laser light (i.e. less than about 20 millijoules).

When the photoinitiator compositions of this invention employ (1) 3,3'-carbonyl bis(7-diethylaminocoumarin); (2) an alkyl ester of p-dialkylamino benzoic acid; and (3) either camphorquinone or a 2,4,5-triphenylimidazolyl dimer the compounds are each employed in amounts which produce a synergistic effect on the speed at which the photopolymerizable compositions containing them polymerize or cure. Generally, the amounts of these compounds which will produce this synergistic effect are:

| COMPOUND | AMOUNT* | AMOUNT* | PREFERRED AMOUNT |
|---|---|---|---|
| 3,3'-carbonyl bis(7-diethyl-aminocoumarin) | 0.25–2.5 | 0.25–2.5 | 0.32 |
| alkyl ester of a p-dialkyl-amino benzoic acid | 1–25 | 1–25 | 7.8 |
| camphorquinone | — | 0.3–25 | 3.9 |
| 2,4,5-triphenylimidazolyl dimer | 0.3–25 | — | 0.65 |

*Weight percent based on the amount of monoethylenically unsaturated monomer in the photopolymerizable composition.

When the photoinitiator compositions of this invention contain (1) 3,3'-carbonyl bis(7-diethylaminocoumarin); (2) an alkyl ester of p-dialkylamino benzoic acid; (3) camphorquinone and (4) a 2,4,5-triphenylimidazolyl dimer these compounds are likewise each employed in amounts which produce a synergistic effect on photopolymerization and especially on photopolymerization effected by visible laser light. In general, the amounts of these compounds which produce such a synergistic effect are:

| *COMPOUND | AMOUNT* | PREFERRED AMOUNT* |
|---|---|---|
| 3,3'-carbonyl bis(7-diethyl-aminocoumarin) | 0.33–2.5 0.32 | 0.32 |
| alkyl ester of a p-dialkyl-amino benzoic acid | 7.5–30 | 7.8 |
| camphorquinone | 3.75–25 | 3.9 |
| a 2,4,5-triphenylimidazolyl dimer | 0.62–25 | 0.65 |

*Weight percent based on the amount of monoethylenically unsaturated monomer in the photopolymerizable composition.

The amounts of the compounds employed in the photoinitiator compositions can also be expressed in terms of weight percent based on the total weight of the photoinitiator composition, i.e. independently of the other ingredients in the photopolymerizable composition. These amounts are as follows:

| COMPOUND | AMOUNT** | AMOUNT** | PREFERRED AMOUNT |
|---|---|---|---|
| 3,3-carbonyl bis (7-diethyl-aminocoumarin) | 0.50–65.8 | 0.50–65.8 | 2.5 |
| alkyl ester of a p-dialkyl-amino benzoic acid | 3.5–97.8 | 3.5–97.8 | 61.6 |
| camphorquinone | — | 1.08–95.2 | 30.78 |
| 2,4,5-triphenylimidazolyl dimer | 1.08–95.2 | — | 5.1 |

| COMPOUND | AMOUNT** | PREFERRED AMOUNT** |
|---|---|---|
| 3,3-carbonyl bis (7-diethyl-aminocoumarin) | 0.41–17.39 | 2.5 |
| alkyl ester of a p-dialkyl-amino benzoic acid | 12.5–86.5 | 61.6 |
| camphorquinone | 6.1–74.7 | 30.8 |
| 2,4,5-triphenylimidazolyl dimer | 1.1–68.3 | 5.1 |

**weight percent of total photoinitiator composition

The photopolymerizable compositions of this invention employ conventional ingredients except the photoinitiator composition is that described above in accordance with this invention. Typical of these compositions are those disclosed in U.S. Pat. No. 3,887,450 (issued June 3, 1975 to Gilano et al; Reexamination Certificate B 13,887,450 issued June 28, 1983) which is hereby incorporated by reference. Thus, the photopolymerizable compositions of this invention typically comprise (1) an addition polymerizable material which is a non-gaseous compound containing at least two terminal ethylenic groups such as an ester of an unsaturated polyol, an unsaturated amide or a vinyl ester; (2) a thermal addition polymerization inhibitor; (3) a macromolecular polymeric binding agent and (4) a photopolymerization initiating composition comprising:
(a) 3,3'-carbonyl bis(7-diethylaminocoumarin);
(b) an alkyl ester of p-dialkylamino benzoic acid; and
(c) either camphorquinone or 2,4,5-triphenylimidazolyl dimer, or a photopolymerization initiating and sensitizing composition comprising:
(a) 3,3'-carbonyl bis(7-diethylaminocoumarin);
(b) an alkyl ester of p-dialkylamino benzoic acid;
(c) camphorquinone; and
(d) a 2,4,5-triphenylimidazolyl dimer.

The photopolymerizable compositions of this invention include those which are developable in both aqueous and nonaqueous media. The following two photopolymerizable compositions illustrate these aqueous and non-aqueous (or organic solvent) developable compositions which may be employed with the photosensitizers of the present invention:

| NON-AQUEOUS DEVELOPABLE PHOTOPOLYMERIZABLE COMPOSITION | |
|---|---|
| Component | Wt % |
| Poly(methyl methacrylate) | 52.5 |
| Trimethylolpropane triacrylate | 18.3 |
| Tetraethylene glycol diacrylate | 15.8 |
| Adhesion promoter | 0.12 |
| Colorant | 0.26 |

AQUEOUS DEVELOPABLE
PHOTOPOLYMERIZABLE COMPOSITION

-continued

| Component | Wt % |
|---|---|
| Scripset 540* | 65.40 |
| Trimethylolpropane triacrylate | 22.60 |
| Tetraethylene glycol diacrylate | 11.30 |
| Antioxidant | 0.11 |
| Adhesion promoter | 0.35 |
| Colorant | 0.25 |

*Styrene-maleic anhydride half ester copolymer sold by Monsanto Co.

Like the photopolymerizable compositions of this invention, the process for making a photoresist in accordance with this invention employs conventional processing steps with the exception that the photopolymerizable composition employed in the process contains one of initiating systems of this invention. A typical conventional process for making a photoresist is disclosed in U.S. Pat. No. 3,953,309 (issued Apr. 27, 1976 to Gilano et al.; Reexamination Certificate B1 3,953,309 issued Apr. 19, 1983) which is hereby incorporated by reference. Thus, a typical process in accordance with this invention comprises (1) preparing a photopolymerizable layer of an addition polymerizable composition, a polymerization initiating system and a thermal addition polymerization inhibitor; (2) exposing a portion of the photopolymerizable layer to actinic light; (4) and washing the layer with a solution which dissolves the unexposed portions of the layer, wherein the polymerization initiating system comprises:

(a) 3,3'-carbonyl bis (7-diethylaminocoumarin);
(b) an alkyl ester of p-dialkylamino benzoic acid; and
(c) either camphorquinone or a 2,4,5-triphenylimidazolyl dimer, or wherein the polymerization initiating system comprises:
(a) 3,3'-carbonyl bis(7-diethylaminocoumarin);
(b) an alkyl ester of p-dialkylamino benzoic acid;
(c) camphorquinone; and
(d) a 2,4,5-triphenylimidazolyl dimer.

In a preferred embodiment, the process of this invention employs visible laser light as the actinic light and the latter, four-compound polymerization initiating system. It has further been found that this four-component polymerization initiating system provides an especially preferred process wherein the actinic light between 480 and 520 nanometers is relatively low power (i.e. less than about 20 millijoules) visible laser light.

The following examples illustrate the present invention. In these examples the following compounds are designated by the following abbreviations:

| COMPOUND | ABBREVIATION |
|---|---|
| Camphorquinone | CAM |
| 3,3'-carbonyl bis(7-diethylaminocoumarin) | BKC |
| ethyl dimethylamino benzoate | EDMAB |
| 2,2'-bis(o-chlorophenyl)-4,4',5,5'-tetraphenylbiimidazole | BCIM |

In each of the following examples, photoresists were prepared by mixing the following ingredients until homogeneous:

| | AMOUNT (Wt %) |
|---|---|
| Multifunctional acrylate monomer | 31.1 |
| Styrene | |
| Butyl acrylate | 51.8 |
| Methacrylic acid | |
| Methylmethacrylate | |
| Adhesion promoter | 3.9 |
| Colorant | 0.05 |
| Antioxidant | 0.02 |
| Flow agent | 0.26 |
| Photosensitizer indicated in TABLE A | See TABLE A |

Each in turn of these photoresists was tested by drawing down the photoresist composition to a thickness of 1.5 mil, drying the photoresist and recovering it as a dry film. The dry film photoresist was then laminated onto a copper board and exposed either in a photoflood sensitivity test which employed an 800 watt photoflash with a Kodak Wratten filter #75 which transmits 23% of the light between 480–520 nanometers, or in a visible laser imaging test which employed the Excellon DIS 2000 visible laser at between 2.0 and 5.0 watts, followed by development in aqueous medium.

TABLE A

| EX. NO. (I or C)* | COMPOSITION (g./Wt %)[1] | PHOTOFLOOD RESULT W/filter - | w/o filter | VISIBLE LASER RESULT**** |
|---|---|---|---|---|
| | INITIATOR | | | |
| 1(C) | BKC (0.20/0.29%) | N.P | — | — |
| 2(C) | BKC (1.0/1.43%) | N.P | — | — |
| 3(C) | BKC (3.0/4.28%) EDMAB (6.0/8.6%) | 0/0 | — | N.P.** |
| 4(I) | BKC (0.25/0.36%) EDMAB (6.0/8.6%) CAM (3.0/4.28%) | 0/10 | — | — |
| 5(C) | EDMAB (3.0/4.28%) CAM (3.0/4.28%) | 0+/3 | 1/9 | — |
| 6(C) | EDMA (6.0/8.6%) CAM (3.0/4.28%) | 0/2 | — | N.P. |
| 7(C) | EDMAB (6.0/8.6%) CAM (6.0/8.6%) | 0/3 | 0/9 | — |
| 8(C) | EDMAB (9.0/12.86%) CAM (9.0/12.86%) | 0/2 | 0/8+ | — |
| 9(C) | EDMAB (6.0/8.6%) BCIM (3.0/4.28%) | 0.0 | — | N.P. |
| 10(C) | Coumarin 6 (1.0/1.43%) EDMAB (12.0/17.1%) BCIM (10.0/14.29%) | 0/3 | — | N.P |
| 11(C) | Coumarin 7 (1.0/1.43%) EDMAB (12.0/17.1%) BCIM (10.0/14.29%) | Matt/2 | — | N.P. |
| 12(C) | Coumarin 6 (0.5/0.71%) EDMAB (6.0/8.6%) BCIM (6.0/8.6%) | 0/3 | — | — |

TABLE A-continued

| EX. NO. (I or C)* | COMPOSITION (g./Wt %)[1] | PHOTOFLOOD RESULT W/filter | PHOTOFLOOD RESULT w/o filter | VISIBLE LASER RESULT**** |
|---|---|---|---|---|
| 13(C) | Coumarin 7 (0.5/0.71%) EDMAB (6.0/8.6%) BCIM (6.0/8.6%) | Matt/2 | — | — |
| 14(C) | BKC (1.0/1.43%) BCIM (1.0/1.43%) | ***S.P | — | — |
| 15(C) | BKC (1.0/1.43%) BCIM (5.0/7.14%) | 0/1 | — | — |
| 16(I) | BKC (1.0/1.43%) EDMAB (0.5/0.71%) BCIM (1.0/1.43%) | S.P. | — | — |
| 17(I) | BKC (1.0/1.43%) EDMAB (3.0/4.28%) BCIM (1.0/1.43%) | 1/4 1/4 | — — | — — |
| 18(I) | BKC (1.0/1.43%) EDMAB (10.0/14.29%) BCIM (12.0/17.1%) | 2/5 | — | N.P. |
| | SENSITIZER | | | |
| 19(C) | EDMAB (3.0/4.28%) BCIM (0.5/0.71%) CAM (3.0/4.28%) | 0+/3 | 2.9 | — |
| 20(C) | EDMAB (3.0/4.28%) BCIM (1.0/1.43%) CAM (3.0/4.28%) | 0+/3- | 2/8 | — |
| 21(C) | EDMAB (6.0/8.6%) BCIM (1.0/1.43%) CAM (3.0/4.28%) | 0/0 | 1/8- | — |
| 22(C) | EDMAB (6.0/8.6%) BENZIL (1.5/2.14%) CAM (3.0/4.28%) | 0/0 | 0/8 | — |
| 23(C) | EDMAB (6.0/8.6%) ethyl dimethyl thioxanthone (0.5/0.71%) CAM (3.0/4.28%) | 0/2 | 1/10 | — |
| 24(C) | EDMAB (3.0/4.28%) I-907 (2.0/2.86%) CAM (3.0/4.28%) | 0/2 | 1/9 | — |
| 25(C) | EDMAB (6.0/8.6%) Irgacure$^R$ 907***** (0.26/0.37%) CAM (3.0/4.28%) | 0/1 | 1/9 | — |
| 26(I) | BKC (0.25/0.36%) EDMAB (6.0/8.6%) CAM (3.0/4.28%) | 0/7 | — | 4.58 |
| 27(I) | BKC (0.26/0.37%) EDMAB (6.0/8.6%) CAM (3.0/4.28%) | 0+/7 | 7/14+ | — |
| 28(C) | BKC (0.26/0.37%) EDMAB (6.0/8.6%) BCIM (0.6/0.86%) Benzoquinone (3.0/4.28%) | N.P. | — | N.P. |
| 29(C) | BKC (0.26/0.37%) EDMAB (6.0/8.6%) BCIM (0.6/0.86%) t-butyl anthra- quinone (3.0/4.28%) | 0/0 | — | N.P. |
| 30(I) | BKC (0.26/0.37% EDMAB (6.0/8.6%) BCIM (0.6/0.86%) CAM (1.5/2.14%) | 1/6+ | 8/16+ | — |
| 31(I) | BKC (0.26/0.37%) EDMAB (6.0/8.6%) BCIM (0.6/0.86%) CAM (2.0/2.86%) | 1/7- | 7+/16+ | — |
| 32(I) | BKC (0.26/0.37%) EDMAB (6.0/8.6%) BCIM (0.6/0.86%) CAM (2.0/2.86%) | 1/7- | 8/16+ | — |
| 33(I) | BKC (0.25/0.36%) EDMAB (6.0/8.6%) BCIM (0.50/0.71%) CAM (3.0/4.28%) | 1/7 | — | 4.66 |
| 34(I) | BKC (0.26/3.7%) EDMAB (6.0/8.6%) BCIM (0.6/0.86%) CAM (3.0/4.28%) | 1+/7 | — | 4.66 |
| 35(I) | BKC (0.26/0.37%) EDMAB (6.0/8.6%) BCIM (0.5/0.71%) CAM (3.0/4.28%) | 1+/7 | 9/14+ | — |

TABLE A-continued

| EX. NO. (I or C)* | COMPOSITION (g./Wt %)[1] | PHOTOFLOOD RESULT W/filter - | w/o filter | VISIBLE LASER RESULT**** |
|---|---|---|---|---|
| 36(I) | BKC (0.26/0.37%) EDMAB (6.0/8.6%) BCIM (0.6/0.86%) CAM (3.0/4.28%) | 1+/7 | 9/16+ | — |

*I = Invention
C = Comparison
**N.P. = No polymerization
***S.P. = Slight polymerization
****Line width (max. = 5.00)

*****Irgacure ® 907 (sold by Ciba Geigy) = 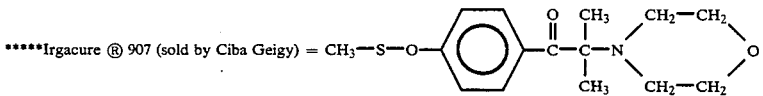

[1]Wt % = based on the amount of monoethylenically unsaturated monomer in the photopolymerizable composition.

In the above examples, the numbers in the "PHOTOFLOOD RESULT" column refer to gloss/step. In order to be considered a satisfactory result the gloss should be other than zero. The gloss present on the surface of a photoresist can be used as a measurement of the degree of surface attack caused by the developing solution. A high degree of gloss would indicate little surface attack which reflects a high degree of crosslinking and subsequent high chemical resistance. Conversely a low gloss matt finish would be characteristic of low crosslink density and undesireable poor chemical resistance. The step (i.e. the amount of polymerization) should be 5 or higher, although gloss is the less important result. Also, a step of 5 or higher in the photoflood test with the filter or 9 or higher without the filter would indicate that the composition would also cure by visible laser imaging. Thus, for example, Examples 30–36 would be expected the cure using visible laser light.

We claim:

1. A composition for initiating and sensitizing the photopolymerization or photocrosslinking of ethylenically unsaturated photocurable materials, said composition comprising:
(a) 3,3'-carbonyl bis(7-diethylaminocoumarin);
(b) an alkyl ester of p-dialkylamino benzoic acid; and
(c) a compound selected from the group consisting of camphorquinone and a 2,4,5-triphenylimidazolyl dimer.

2. The composition of claim 1 wherein the alkyl ester of p-dialkylamino benzoic acid is ethyl p-diethylamino benzoate.

3. The composition of claim 1 wherein component c is 2, 2'-bis (o-chlorophenyl)-4,4',5,5'-tetraphenyl biimidazole.

4. The composition of claim 1 wherein component c is 2,2'-(o-methoxyphenyl) -4,4',5,5'-tetraphenyl biimidazol 5. The composition of claim 1 wherein component c is camphorquinone.

6. The composition of claim 1 wherein components a, b and c are present in the following amounts:
a. about 0.5 to about 65.8%
b. about 3.5 to about 97.8%
c. about 1.08 to about 95.2%
where all percentages are by weight based on the total weight of the composition.

7. A composition for initiating and sensitizing the photopolymerization or photocrosslinking of ethylenically unsaturated photocurable materials, said composition comprising:
(a) 3,3'-carbonyl bis(7-diethylaminocoumarin);
(b) an alkyl ester of p-dialkylamino benzoic acid;
(c) camphorquinone; and
(d) a 2,4,5-triphenylimidazolyl dimer 8. The composition of claim 7 wherein the 2,4,5-triphenylimidazolyl dimer is 2,2'-bis(o-chlorophenyl)-4,4'5,5'-tetraphenyl biimidazole.

9. The composition of claim 7 wherein the 2,4,5-triphenylimidazolyl dimer is 2,2'-(o-methoxyphenyl)-4,4'5,5'-tetraphenyl biimidazole.

10. The composition of claim 7 wherein the alkyl ester of p-dialkylamino benzoic acid is ethyl p-diethylamino benzoate.

11. The composition of claim 7 wherein the components a, b and c are present in the following amounts:
a. about 0.5 to about 65.8%
b. about 3.5 to about 97.8%
c. about 1.08 to about 95.2%
where all percentages are by weight based on the total weight of the compositions.

12. In a photopolymerizable composition comprising an addition polymerizable compound containing ethylenic unsaturation, and a photopolymerization initiating and sensitizing composition, the improvement wherein the photopolymerization initiating and sensitizing composition comprises:
(a) 3,3'-carbonyl bis(7-diethylaminocoumarin);
(b) an alkyl ester of p-dialkylamino benzoic acid; and
(c) a compound selected from the group consisting of camphorquinone and a 2,4,5-triphenylimidazolyl dimer.

13. The photopolymerizable composition of claim 12 wherein the alkyl ester of p-dialkylamino benzoic acid is ethyl p-dialkylamino benzoate.

14. The photopolymerizable composition of claim 12 wherein component c is camphorquinone.

15. The photopolymerizable composition of claim 12 wherein component c is 2,2'-bis(o-chlorophenyl)-4,4',5,5'-tetraphenyl biimidazole.

16. The photopolymerizable composition of claim 12 wherein component c is 2,2'-bis(o-methoxyphenyl)-4,4',5,5'-tetraphenyl biimidazole.

17. The photopolymerizable composition of claim 12 wherein components a, b and c are present in the following amounts:
a. about 0.25 to about 2.5%
b. about 1 to about 25%
c. about 0.3 to about 25%
where all percentages are by weight based on the amount of monoethylenically unsaturated monomer in the photopolymerizable composition.

18. In a photopolymerizable composition comprising an addition polymerizable compound containing ethylenic unsaturation, and a photopolymerization initiating and sensitizing composition, the improvement wherein the photopolymerization initiating and sensitizing composition comprises:
(a) 3,3'-carbonyl bis(7-diethylaminocoumarin);
(b) an alkyl ester of p-dialkylamino benzoic acid;
(c) camphorquinone; and
(d) a 2,4,5-triphenylimidazolyl dimer.

19. The photopolymerizable composition of claim 18 wherein the 2,4,5-triphenylimidazolyl dimer is 2,2'-(o-chlorophenyl)-4,4'5,5'-tetraphenyl biimidazole.

20. The photopolymerizable composition of claim 18 wherein the 2,4,5-triphenylimidazolyl dimer is 2,2'-(o-methoxyphenyl)-4,4'5,5'-tetraphenyl biimidazole.

21. The photopolymerizable composition of claim 18 wherein the alkyl ester of p-dialkylamino benzoic acid is ethyl p-diethylamino benzoate.

22. The photopolymerizable composition of claim 18 wherein components a, b, c and d are present in the following amounts:
a. about 0.33 to about 2.5%
b. about 7.5 to about 30%
c. about 3.75 to about 25%
d. about 0.62 to about 25%
where all percentages are by weight based on the amount of monoethylenically unsaturated monomer in the photopolymerizable composition.

23. In a process for making a photoresist which comprises preparing a photopolymerizable layer containing an addition polymerizable material and a polymerization initiating system; exposing a portion of said photopolymerizable layer to actinic light; and washing said layer with a solution which dissolves the unexposed portion of the photopolymerizable layer, the improvement comprising a polymerization initiating system comprising
(a) 3,3'-carbonyl bis (7-diethylaminocoumarin);
(b) an alkyl ester of p-dialkylamino benzoic acid; and
(c) a compound selected from the group consisting of camphorquinone and a 2,4,5-triphenylimidazolyl dimer.

24. The process of claim 23 wherein the alkyl ester of p-dialkylamino benzoic acid is ethyl p-diethylamino benzoate.

25. The process of claim 23 wherein component c is camphorquinone.

26. The process of claim 23 wherein component c is 2,2'-bis (o-chlorophenyl)-4,4',5,5'-tetraphenyl biimidazole.

27. The process of claim 23 wherein component c is 2,2'-bis (o-methoxyphenyl)-4,4',5,5'-tetraphenyl biimidazole.

28. The process of claim 23 wherein components a, b and c are present in the following amounts:
a. about 0.25 to about 2.5%
b. about 1 to about 25%
c about 0.3 to about 25%
where all percentages are by weight based on the weight of monoethylenically unsaturated monomer in the polymerizable material.

29. In a process for making a photoresist which comprises preparing a photopolymerizable layer containing an addition polymerizable material and a polymerization initiating system; exposing a portion of said photopolymerizable layer to actinic light; and washing said layer with a solution which dissolves the unexposed portion of the photopolymerizable layer, the improvement comprising a polymerization initiating system comprising:
(a) 3,3'-carbonyl bis(7-diethylaminocoumarin);
(b) an alkyl ester of p-dialkylamino benzoic acid;
(c) camphorquinone; and
(d) a 2,4,5-triphenylimidazolyl dimer.

30. The process of claim 29 wherein the actinic light is laser radiation.

31. The process of claim 29 wherein the laser radiation is low power laser radiation.

32. The process of claim 29 wherein the alkyl ester of p-dialkylamino benzoic acid is ethyl p-diethylamino benzoate.

33. The process of claim 29 wherein the 2,4,5-triphenylimidazole dimer is 2,2'-bis(o-chlorophenyl)-4,4',5',5'-tetraphenyl biimidazole.

34. The process of claim 29 wherein the 2,4,5-triphenylimidazole dimer is 2,2'-bis(o-methoxyphenyl)-4,4',5,5'-tetraphenyl biimidazole.

35. The process of claim 29 wherein components a, b, c and d are present in the following amounts:
a. about 0.33 to about 2.5%
b. about 7.5 to about 30%
c. about 3.75 to about 25%
d. about 0.62 to about 25%
where all percentages are by weight based on the amount of monoethylenically unsaturated monomer in the polymerizable material.

* * * * *